Sept. 30, 1969 T. J. SCARPA 3,470,388

DIFFERENTIAL AMPLIFIER CIRCUITS

Original Filed June 16, 1964 4 Sheets-Sheet 1

INVENTOR
T. J. SCARPA
BY Martha G. Pugh
ATTORNEY

INVENTOR
T. J. SCARPA
BY Martha G. Pugh
ATTORNEY

INVENTOR
T. J. SCARPA
BY [signature]
ATTORNEY

DIFFERENTIAL AMPLIFIER CIRCUITS

Original Filed June 16, 1964 4 Sheets-Sheet 4

INVENTOR
T. J. SCARPA
BY Martha G. Pugh
ATTORNEY 3,470,388
United States Patent Office
Patented Sept. 30, 1969

3,470,388

DIFFERENTIAL AMPLIFIER CIRCUITS

Thomas J. Scarpa, Metuchen, N.J., assignor to Edison Instruments, Inc.

Original application June 16, 1964, Ser. No. 375,537, now Patent No. 3,335,606, dated Aug. 15, 1967. Divided and this application Aug. 4, 1967, Ser. No. 669,999
Int. Cl. H03k 5/20
U.S. Cl. 307—235 4 Claims

ABSTRACT OF THE DISCLOSURE

There are disclosed differential amplifier circuits for comparing a selected alternating current input signal with a reference signal of the same frequency and phase. In each case the circuit comprises a pair of substantially identical current discharge devices, each comprising a current emitter, a current collector, and a control electrode. The two devices are connected in tandem relation to a common output circuit disposed across the collector electrodes. The signals to be compared are impressed across the respective emitter electrodes and are added algebraically in the common output circuit. The difference curent so derived is impressed on a gating circuit which is controlled by a pulsing source synchronized with the input signals. The polarity and amplitude of the pulsed output of the gating circuit depends on whether the selected input signal is above or below the reference input signal and the magnitude of the difference.

This invention relates to differential amplifier circuits of general application, initially disclosed in my application Ser. No. 375,537 (Patent 3,335,606 issued Aug. 15, 1967) relating to Double Thermistor Flowmeters, filed June 16, 1964, of which this application is a division.

The parent application relates to thermistor flowmeters of a type which rely for their operation on the balancing of responses between a test thermistor and a control thermistor in a differential amplifier circuit. The flowmeter disclosed in my application Ser. No. 375,537 (Patent 3,335,606 issued Aug. 15, 1967) comprises as one of its working elements a probe, including a pair of thermistors, which is interposed into the path of the flow at a precise point wherein the disturbance or distortion to the flow is at a minimum. Of the two thermistors included in the probe, only one, which is surrounded by a heating coil, is responsive to changes in the rate of flow, whereas the other serves as a control, responsive only to changes in the ambient conditions in the environment of the flow. The two thermistors are housed together in an epoxy plug, supported in a pipe fitting which is screwed or otherwise interposed into the pipe section in the path of the flow to be measured. When the fluid under test begins to flow, heat is conducted away from the thermistor surrounded by the heating coil causing it to undergo a temperature change which is a function of the rate of flow, changes in ambient temperature being compensated for by the presence of the control thermistor in contact with the test fluid.

The control thermistor and the flow measuring thermistor are connected as separate arms of a conventional bridge circuit which is completed by two balancing arms. One pair of terminals of the bridge circuit is connected across an alternating current source; whereas the diametrically opposite pair of bridge terminals is connected across a circuit which is so constructed that the output voltage, which has the same frequency characteristics as the signal interposed from the alternating current source, varies in polarity and magnitude in accordance with the difference in response between the flow measuring thermistor and the control thermistor.

A particular object of the specific circuit of the present invention is to provide greater circuit facility for comparing a derived signal with a reference signal.

In accordance with one embodiment of the invention disclosed in my application Ser. No. 375,537 (Patent 3,335,606 issued Aug. 15, 1967), supra, the unbalanced output voltage across the Wheatstone bridge circuit is imposed across a novel differential amplifier circuit which produces an output voltage which is either in phase or 180 degrees out of phase with the signal imposed across the bridge circuit by an alterating current oscillator, depending on whether the response in the flow measuring thermistor is less or greater than the response of the control thermistor. This phase reversible output signal, after amplification, is imposed on a gating circuit which is synchronized with square-wave pulses triggered by the alternating current oscillator to modulate the amplified signal in a series of pulses, the polarity of which depends on the relative amplitudes of the two thermistor signals. The pulse series is again amplified and imposed on an integrator circuit including a capacitor, which is charged or discharged depending on the polarity of the imposed pulses. The output from the integrator circuit drives a power circuit which is connected through a wattmeter to the heater coil surrounding one of the thermistors. The power circuit is caused to increase or decrease the energy supplied to the heater in such a manner as to tend to rebalance the bridge circuit. In my parent application Ser. No. 375,537 (Patent 3,335,606 issued Aug. 15, 1967, supra, the wattmeter is calibrated to read in terms of velocity of flow, volumetric flow or mass flow in the flowmeter.

For the purposes of illustration, the novel differential amplifier circuit, which will be disclosed and claimed in greater detail hereinafter, has been described as a component of a double thermistor flowmeter circuit where it serves to compare the responses between the flow measuring thermistor and a control thermistor. It will be appreciated, however, that the differential amplifier circuit particularly disclosed and claimed herein is of general utility, applicable to any system in which it is desired to compare the amplitude of a given signal with that of a preselected reference signal.

Particular advantages of the differential amplifier of the present invention are:

(1) Signals of the same frequency are applied to both of the twin input circuits;

(2) The phase of the output signal is a function of the amplitude difference between the two input signals;

(3) The amplitude of the output is a function of the magnitude of the unbalance between the applied signal and the reference signal; and (4) The phase of the output is dependent on the direaction of the unbalance between the applied signal and the reference signal.

These and other objects, features, and advantages will be apparent to those skilled in the art upon a detailed study of the specification hereinafter, including the attached drawings, in which.

Figure 2:
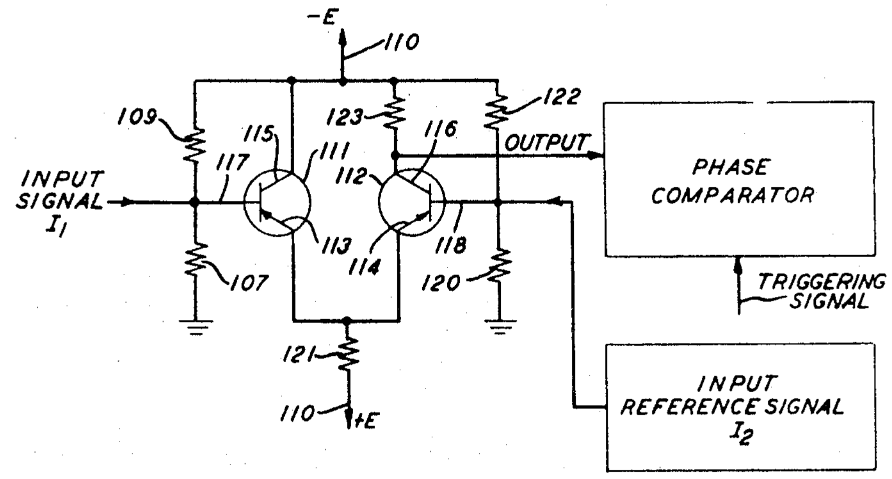
FIGURE 2 is a schematic showing of a differential amplifier circuit of the present invention which is incorporated as the part of the flowmeter of FIGURE 1.
Figure 4:
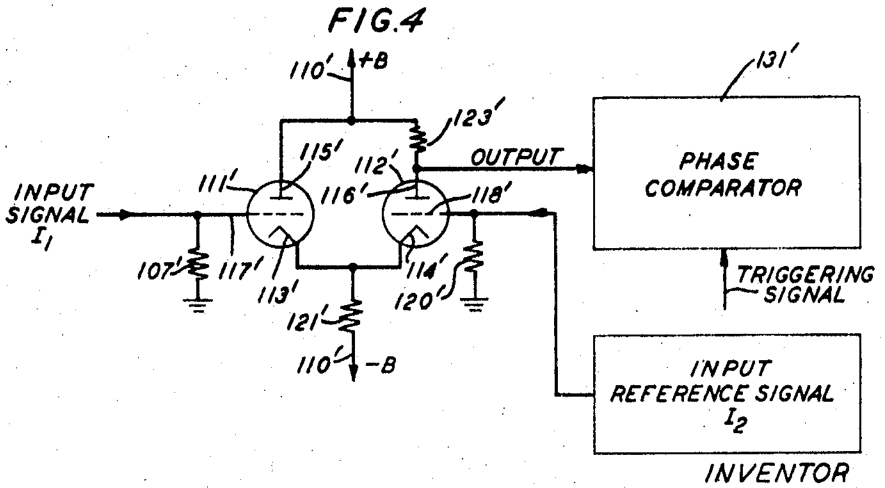
Figure 5:
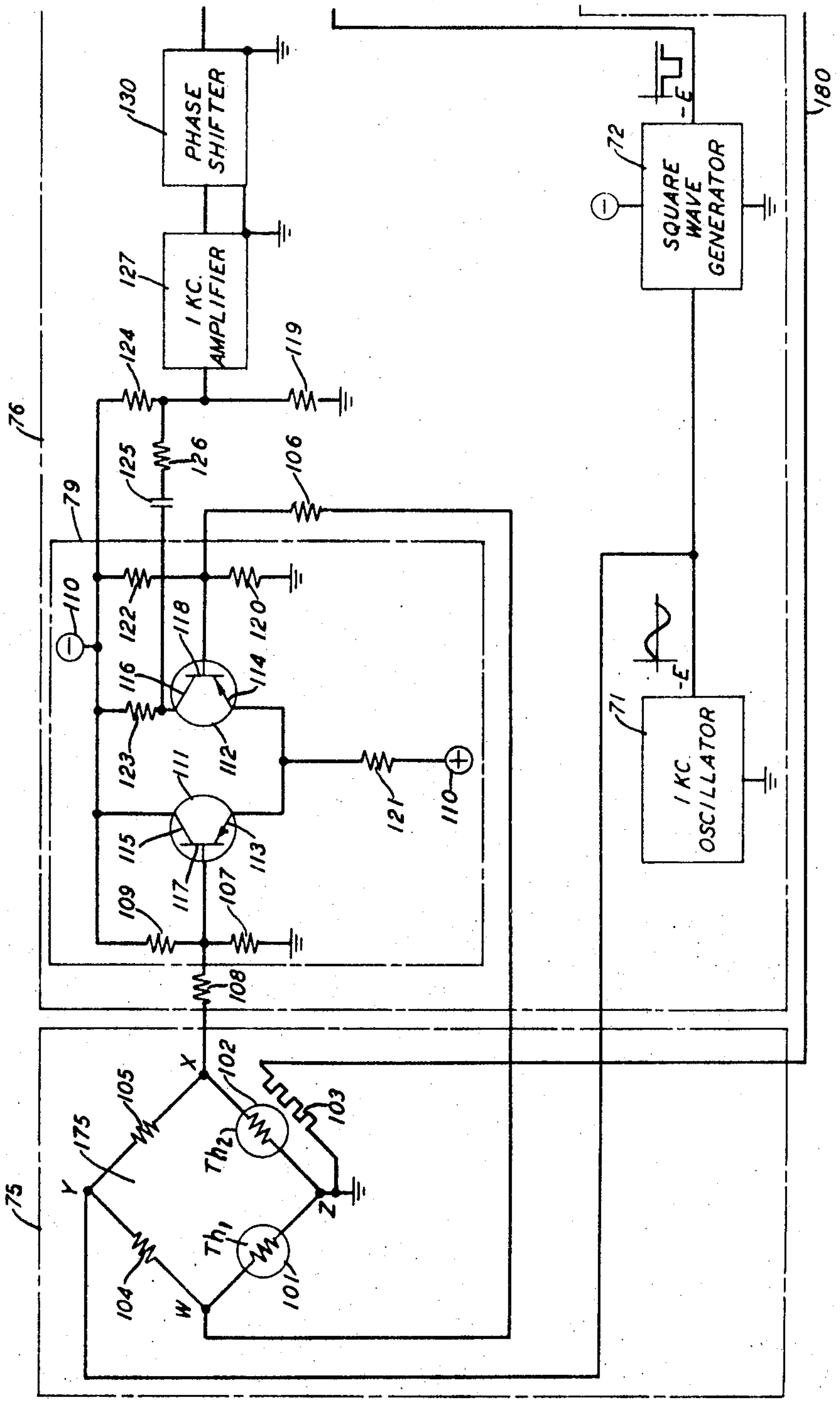
Figure 6:
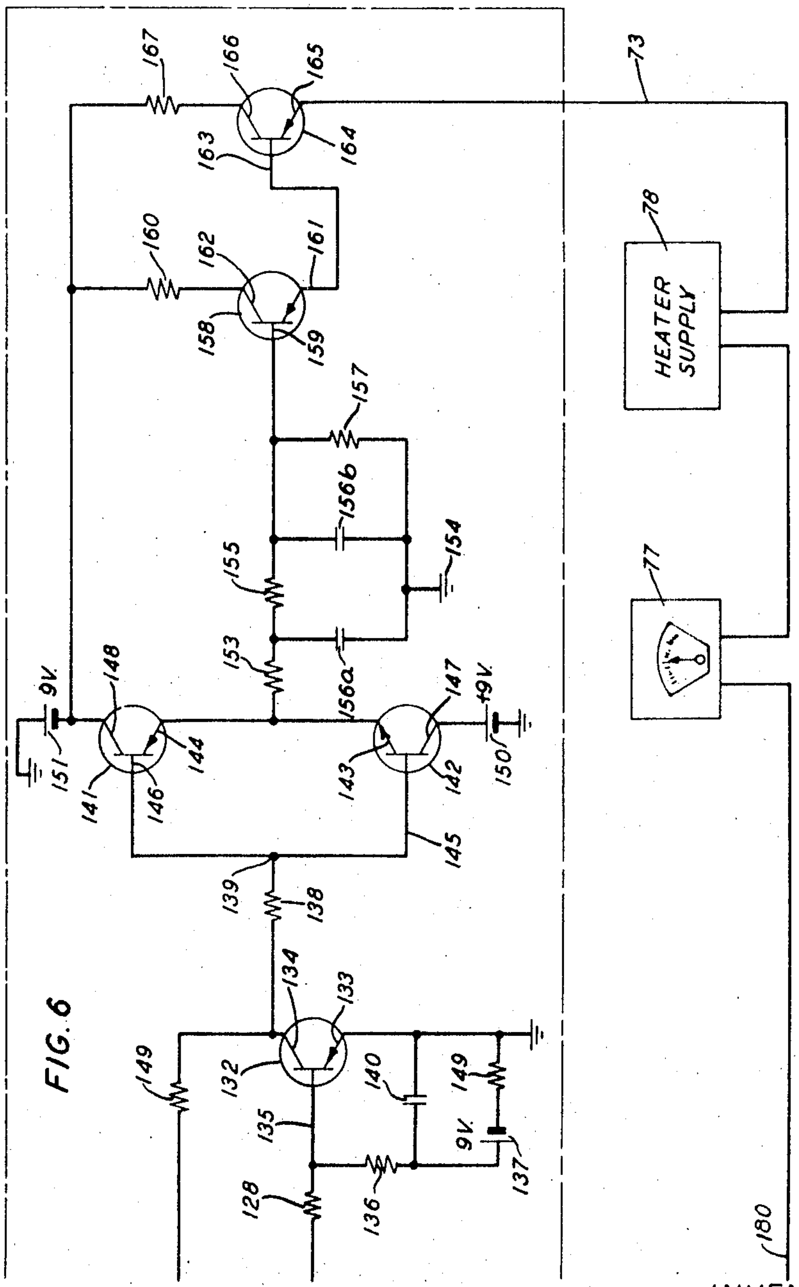

FIGURES 3A, 3B, 3C, and 3D are diagrams of signal voltage plotted against time to illustrate the theory of operation of the circuit of FIGURE 2;

FIGURE 4 is a schematic showing of a modification of the differential amplifier circuit of FIGURE 2; and FIGURES 5 and 6, mounted with FIGURE 5 to the left and FIGURE 6 to the right, constitute an over-all schematic showing of an alternative embodiment of the flowmeter of the parent invention, including the differential amplifier of FIGURE 2.

Figure 1:
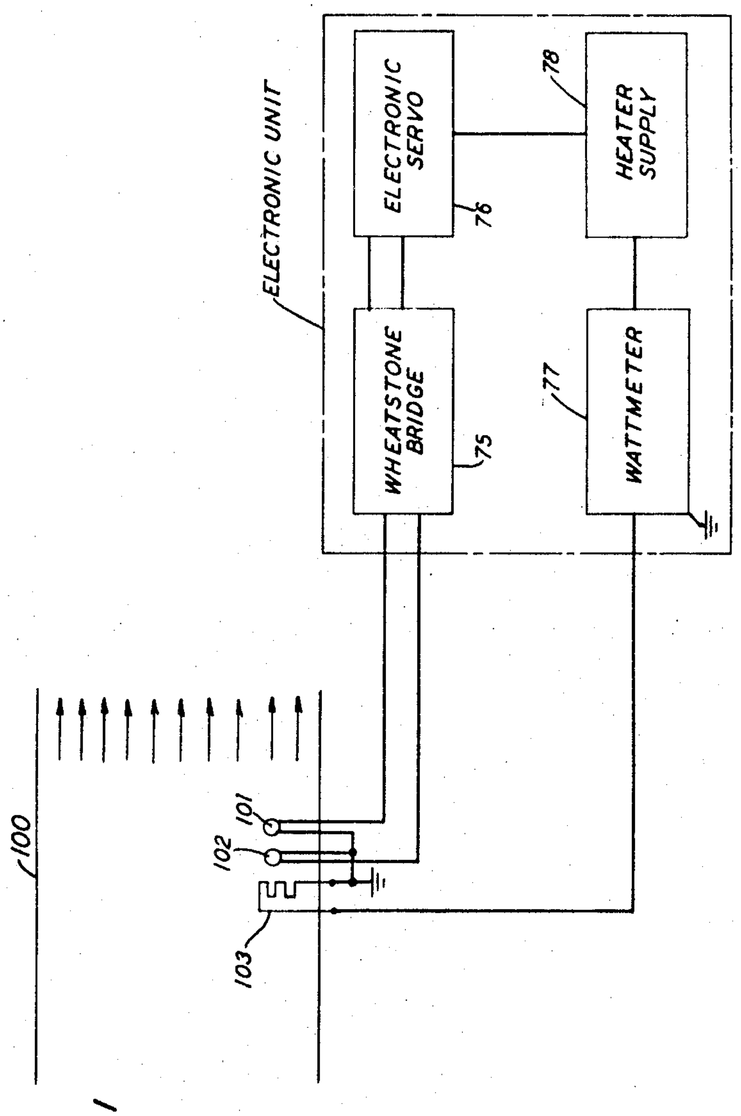
FIGURE 1 is a block diagram showing in combination the various components of the flowmeter of the present invention.

Referring in detail to the block diagram indicated in FIGURE 1 of the drawings, a pair of thermistors 101 and 102 are mounted side-by-side in any epoxy plug in a probe assembly which is described in detail in my parent application Ser. No. 375,537 (Patent 3,335,606 issued Aug. 15, 1967). Thermistor 102, which normally has about one-third the resistance of thermistor 101, is wrapped with a heating coil 103.

Thermistors 101 and 102, in the probe assembly are interposed into the interior of pipe 100 in contact with the test fluid. The optimum position of the probe in the test pipe is critical, as explained in the parent application, supra.

The heater 103 which is wrapped around thermistor 102, is supplied with energy from the heater supply source 78, which may comprise any type of power source well-known in the art, which is constructed to provide a power output ranging up to 500 milliwatts, with a voltage drop ranging from one to five volts across heater 103, at a frequency of, say, 60 cycles per second. The thermistors 101 and 102 are connected into a Wheatstone bridge 75, which is adjusted to balance under a condition of no-flow in the test conduit.

The flowmeter operates essentially as a self-balancing calorimeter. When the bridge 75 becomes unbalanced due to flow, heat loss from thermistor 102 is automatically replenished by operation of the electro servo circuit 76 which actuates the heater supply 78 to increase the amount of heat delivered to the heater circuit 103. The actual power required to operate the flowmeter is measured on a milliwatt meter 77.

Theoretical considerations relating to the calibration of the flowmeter are discussed in detail in my parent application Ser. No. 375,537 (Patent 3,335,606 issued Aug. 15, 1967) which also describes, in detail, the probe assembly, and probe placement.

In accordance with a preferred embodiment of the present invention, the transistor servo system 76, shown and described in the parent application Ser. No. 375,537 (Patent 3,335,606 issued Aug. 15, 1967) is replaced by a circuit 76' shown schematically, in its entirety, in FIGURES 5 and 6 of the drawings, mounted side-by-side, with FIGURE 5 to the left and FIGURE 6 to the right. The transistor differential amplifier unit, which is indicated by the dotted line box marked 79 in FIGURE 5, is shown separately in FIGURE 2 of the drawings, together with FIGURES 3A, 3B, 3C, and 3D, which are graphical showings of signal voltages used in an explanation of its operation, and FIGURE 4, which is an alternative form the differential amplifier using vacuum tubes.

Referring now to the circuit of FIGURES 5 and 6, as in thermistors 101 and 102 are connected in a Wheatstone bridge 75, the balancing arms of which comprise the resistors 104 and 105. It will be assumed that the components of the bridge circuit 75 and the probe assemblage, including thermistors 101 and 102 and heater circuit 103, are similar to those described in my parent application Ser. No. 375,537 (Patent 3,335,606 issued Aug. 15, 1967), supra.

An oscillator 71, which may be of any of the types well-known in the art, and which in the present illustrative embodiment supplies alternating current up to frequencies of one kilocycle, at a maximum power of one watt, and a peak-to-peak voltage of 50 volts, is connected to terminal Y of bridge circuit 75 at the junction between balancing arms 104 and 105. In addition to imposing a high frequency alternating current across the Y–Z terminals of the Wheatstone bridge 75, the oscillator 71 is simultaneously connected to trigger a square-wave pulse generator 72. The latter may assume any of the types well-known in the art, such as, for example, the circuit configuration known as the Schmitt trigger, referred to with reference to figure 2 in my parent application Ser. No. 375,537 (Patent 3,335,606 issued Aug. 15, 1967), supra, which is shown in FIG. 28.10 and described in detail in Section 28.4, et seq., beginning on page 381 of Transistor Circuit Design, prepared by the Engineering Staff of Texas Instruments Incorporated, McGraw-Hill Book Company, Inc., New York, N.Y., 1963. This circuit produces a square top pulse having a maximum negative voltage of, say, nine volts at a repetition rate which is thereby synchronized with the alternating current oscillations imposed across the Wheatstone bridge 75. The negative pulses from square-pulse source 72 which, for example, have a mark duration of one millisecond and a space duraiton of one millisecond (for the purpose of the present illustration, utilizing a one kilocycle triggering source) are imposed through a conducting lead including the 100,000 ohm resistor 128 on the base electrode of transistor 132 in a gate circuit connected in a manner to be presently described.

The W–X terminals of bridge circuit 75 are connected to opposite terminals of the differential amplifier circuit 79, including transistors 111 and 112. The W terminal is at the junction between thermistor 101 and the arm 104; and, the X terminal is at the junction between the heated thermistor 102 and the balancing arm 105. Transistors 111 and 112 of the differential amplifier circuit may, for example, be Radio Corporation of America p-n-p type germanium transistors 2N1305, or any of the p-n-p types indicated in Table II, hereinbefore. The transistor 111 has emitter, collector, and base electrodes 113, 115, and 117, respectively; and, transistor 112 has emitter, collector, and base electrodes 114, 116, and 118, respectively. The emitters 113 and 114 are connected to a common junction, which is connected through a 15,000 ohm resistor 121 to the positive terminal of a nine volt battery 110, to the negative terminal of which is connected the collector 115. The collector 116 is connected through a 4700 ohm resistor 123 to the negative terminal of the nine volt source 110.

The X terminal of bridge circuit 75 is connected through the 100,000 ohm resistor 108 to the base electrode 117 of transistor 111, across the 68,000 ohm resistor 107 to ground. Base electrode 117 is also connected through the 100,000 ohm resistor 109 to the negative terminal of the nine volt source 110.

On the opposite side of the differential amplifier, the base electrode 118 of transistor 112 is connected to the W terminal of the bridge circuit through the 100,000 ohm resistor 106, across the 68,000 ohm resistor 120 to ground. Base electrode 118 is also connected to the negative terminal of the nine volt source 110 through the 100,000 ohm resistor 122.

The output circuit of the differential amplifier is connected to the junction between resistor 123 and collector 116, and passes through the two microfarad capacitor 125 in series with the 100,000 ohm resistor 126, to the high potential input terminal of the one kilocycle amplifier 127, across the 68,000 ohm resistor 119 to ground. The input terminal of amplifier 127 is connected through 100,000 ohm resistor 124 to the negative terminal of the nine volt source 110. The amplifier 127 may be selected from any of the audio-amplifier types well-known in the art, which operate with substantially zero phase shift in the one megacycle range. The output terminals of the one kilocycle amplifier 127 are connected across the input terminals of a phase shifter 130. The output circuit of the latter is connected in series with a 10,000 ohm resistor 149 to the collector 134 of a transistor 132. Phase shifter 130 may assume any of the forms well-known in the art, such as shown and described, for example, in Electronic Measurements by Terman and Pettit, Second Edition, McGraw- Hill, New York (1952), fig. 633A and page 277, paragraphs 6–11 entitled "Phase Shifters."

Transistor 132 is the principal element of a transistor gate circuit of the form described in detail in my application Ser. No. 345,780, filed Feb. 18, 1964. The transistor 132 comprises an emitter electrode 133, a base electrode 135, and a collector electrode 134. The square-wave pulse source 72, of a form previously described, is connected in series with a 100,000 ohm resistor 128, to the base electrode 135 of transistor 132. It will be apparent, however, that any of the other types of gate circuits well-known in the art can be substituted for the particular type shown and described herein.

Assume, for example, that the transistor 132 is a p-n-p junction transistor, such as Radio Corporation of America type 2N1305 or one of the other p-n-p types disclosed in Table II, hereinbefore. Mark pulses from the square-wave source 72, when imposed on the base electrode 135 of the transistor 132, will be negative and of such a polarity as to drive the transmitter into current conduction between the collector electrode 134 and the emitter electrode 133, to a condition of saturation for the duration of such pulses. Between the base electrode 135 and emitter electrode 133, is connected a back-biasing source 137 of, for example, nine volts, the positive terminal of which is connected through the one megohm resistor 136 to the base 135; and, the negative terminal of which is connected through the 27,000 ohm resistor 149 to ground. A 10 microfarad capacitor 140 is connected between the positive terminal of the back-biasing source 137 and ground.

The output terminal connected from the collector electrode 134 passes through a 27,000 ohm resistor 138 to a push-pull circuit comprising a pair of transistors 141 and 142, of opposite conductivity types, p-n-p and n-p-n, respectively, and which pair may be selected from those disclosed, for example, in Table II, hereinbefore. Transistor 141 has emitter, collector, and base electrodes, respectively 144, 148, and 146; and, transistor 142 has emitter, collector, and base electrodes, respectively 143, 147, and 145. The two base electrodes 145 and 146 are connected together at the input of the push-pull circuit at junction 139, to one terminal of the resistance 138. The collector electrodes 148 and 147 are respectively connected, the one to the negative terminal of the nine volt source 151, and the other, to the positive terminal of the nine volt source 150, the opposite terminals of the latter sources being grounded.

Emitter electrodes 143 and 144 are connected together to an integrator circuit, which includes the following elements. The 100,000 ohm resistor 153 is connected in series with a 1000 ohm resistor 155, the junction between resistors 153 and 155 being connected to ground 154 through the two microfarad capacitor **156*a*. The other terminal of resistor 155, which is connected to base electrode 159 of transistor 158, is also connected to ground through the 100 microfarad capacitor 156*b*. Resistor 157 is connected in parallel with capacitor 156*b* to ground across the base electrode 159 of transistor 158, which has an emitter electrode 161, and a collector electrode 162. Transistor 158**, in the present embodiment, is a p-n-p type, which may be selected from those set forth in Table II, of parent application Serial No. 375,537 (Patent 3,335,606 issued Aug. 15, 1967), supra.

Transistor 158, together with the transistor 164, which is a similar type, functions as a direct current control amplifier circuit for the integrated direct current derived from the pulses that are passed from the push-pull circuit through the integrator circuit just previously described. In detail, the direct current amplifier circuit consists of the following elements. A 47,000 ohm resistor 160 is connected to the negative terminal of the nine volt battery 151. The emitter 161 of transistor 158 is connected to the base 163 of transistor 164, which has an emitter electrode 165 and a collector electrode 166. The latter is connected through the 1000 ohm resistor 167, to the negative terminal of the nine volt battery 151. Emitter 165 is connected through a lead 73 which carries the integrated direct current to drive the heater power supply circuit 78, previously described with reference to FIGURES 1 and 2. The output from the heater supply circuit 78 then passes through the milliwatt meter 77 to the heater circuit 103 of thermistor 102 in the probe assembly, where it operates to belance bridge circuit 75, as previously described.

The circuit operation of FIGURES 5 and 6 can be best understood by a preliminary analysis of the operation of the differential amplifier circuit including transistors 111 and 112, which is indicated with the dotted line box marked 79, with reference to FIGURES 2 and 3A, 3B, 3C, and 3D of the drawings.

Referring to FIGURE 2, input signals from the two separate sources, which will be designated $I_1$ and $I_2$, are imposed on the two sides of the differential amplifier circuit. These two signals are of the same frequency and phase, the only parameter by which they differ being the amplitude. Let us assume that the amplitude of the input signal $I_1$, which is imposed on the base circuit 117 may then be equal to, less than, or greater than the signal $I_2$.

The present circuit so functions that when the two signals are equal in amplitude, zero output voltage is produced in the signal output circuit between collector 116 and ground in the circuit of transistor 112. When one of signals $I_1$ and $I_2$ differs in amplitude from the other, the voltage across the output circuit is proportional to the difference. Thus, the phase of the output signal, when compared to one of the input signals, will clearly show whether the other input signal is larger or smaller in amplitude. This is better understood by reference to FIGURES 3A, 3B, 3C, and 3D of the drawings.

Figure 3A:
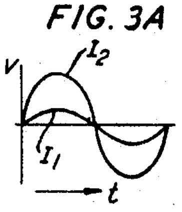
Figure 3B:
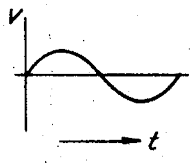
Figure 3C:
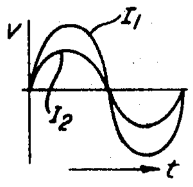
Figure 3D:
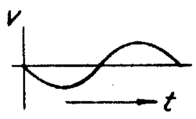

In FIGURES 3A and 3B, which represent the first case, it is assumed that the input signal $I_1$ is less than the reference signal $I_2$. In this case the output signal, as shown in FIGURE 3B, is in phase with the input signal and has an amplitude which is equal to the difference of the two signals, that is, the amplitude of signal $I_2$ minus the amplitude of signal $I_1$. In the second case the input signal $I_1$ is greater than the reference signal $I_2$, as indicated in FIGURE 3C. Thus, as shown in FIGURE 3D, in this case the output signal is out of phase with the reference signal and has an amplitude which is equal to the absolute value of the amplitude of signal $I_2$ minus the amplitude of signal $I_1$. The negative value indicates a phase reversal of 180 degrees. Thus the amplitude of the output signal will indicate by what amount it is larger or smaller than the reference signal; and, the phase of the output signal will indicate which of the two signals is larger.

Under the foregoing conditions, the circuit of FIGURE 2 will be seen to function as a precise amplitude comparator between two signals of the same frequency and phase which differ only in amplitude. Thus, assume that the output from this differential amplifier circuit coming off of the collector 116 of the transistor 112 passes through a phase shifter 130 and is then imposed on a phase comparator circuit, which may take the form of a gating circuit such as that comprising the transistor 132 as indicated in FIGURE 6, which is triggered by a series of gating pulses synchronized with and in phase with the input pulses $I_1$ and $I_2$ Thus, the gate will be open to pass either the positive half cycle or the negative half cycle, depending on whether the amplifier output is in phase with or cut of phase with the triggering signals. The polarity of the series of output pulses from the phase comparator then indicates whether the amplitude of signal $I_1$ is less than or greater than the amplitude of signal $I_2$. A zero output of the phase comparator implies that the two components have equal amplitude.

It will be apparent to those skilled in the art that in accordance with the present invention, instead of a circuit utilizing a pair of transistor 111 and 112, as indicated in FIGURE 2, there can be substituted therefor a vacuum tube circuit of the form shown in FIGURE 4. In FIGURE 4, vacuum tube 111' has a plate 115', cathode 113', and grid 117'; and, vacuum tube 112' has a plate 116', cathode 114', and grid 118'. The two cathodes 113' and 114' are connected together to a 15,000 ohm resistor 121' which is connected to a 150 volt B− source 110'. The plate 116' is connected through the 10,000 ohm resistor 123' to the B+ terminal of the 300 volt source 110', to which terminal is also connected the plate 115'. The output from the plate 116' is connected through amplifier 127 and phase shifter 130 to the phase comparator circuit including the gating circuit comprising transistor 132 (as shown in FIG. 6).

In a manner similar to the operation of the transistor circuit shown in FIGURE 2, the vacuum tube circuit of FIGURE 4 functions with signal $I_1$ being applied to the grid 117' across the resistance 107'; and, signal $I_2$ being applied to the grid 118' across the resistance 120'. Thus, the signal output which is measured in the phase comparator including transistor 132 (as shown in FIG. 6) 131 will be similar to that derived from the circuit of FIGURE 2 and will correspond to the showings of FIGURES 3A, 3B, 3C, and 3D.

Let us now return to a discussion of the operation of the circuit of FIGURES 5 and 6 of the drawings. The two signals, $I_1$ and $I_2$, which were respectively applied to the bases 118 and 117 of the transistors 111 and 112, are derived as follows. Signal $I_1$ is derived directly from the X terminal of the bridge circuit 75, at the junction between thermistor 102 and resistor 105, through the 100,000 ohm resistor 108. The reference signal $I_2$ is derived from the W terminal of the bridge 75, at the junction between thermistor 101 and resistor 104, through the 70,000 ohm resistor 106. These two signals, after passing through a respective one of transistors 111 and 112, are superposed in the collector circuit of the transistor 112, which is connected through the two microfared capacitor 125 and the 1000 ohm resistor 126 to the terminal of the one kilocycle amplifier 127, the output from which passes through the phase shifter 131. The signals imposed on the input circuit of the amplifier 127 are either in phase with or 180 degrees out of phase with the synchronizing signal from the one kilocycle oscillator 71. The amplified signal from amplifier 127 passes through the phase shifter 131 to the collector 135 of the transistor gate circuit 132. The latter is triggered to conducting and nonconducting condition by a series of negative pulses from the squarewave pulse source 72, the frequency or repetition rate of which is in turn controlled by the one kilocycle oscillator 71. Thus, there appears at the collector of the transistor 132 a series of pulses having a repetition rate which is synchronous with the frequency of the one kilocycle oscillator 71, which pulses are positive or negative depending on whether the signal output of the differential amplifier is over or under the amplitude of the reference signal. A zero output indicates that the two amplitudes are equal.

Accordingly, a series of positive or negative pulses, whichever may be the case, is then amplified through the push-pull transistor circuit including the transistors 141 and 142. The amplified signal from the push-pull circuit including transistors 141 and 142, is then impressed on the integrator circuit where it operates to charge or discharge capacitors 156a and 156b, depending on the polarity. The integrated output, of one polarity or the other, is then amplified in the direct current amplifier including transistors 158 and 164, the amplified output of which is used to drive a power amplifier in heater supply circuit 78. The heater power, which varies as the output of the transistor servo system 76, passes through the milliwatt meter 77 and into heater circuit 103, wrapped around thermistor 102, causing the latter to heat up and change its resistance, thereby tending to bring the bridge 75 into a condition of balance.

As in the embodiment described in my parent application Ser. No. 375,537 (Patent 3,335,606 issued Aug. 15, 1967), supra, the milliwatt meter 77 may be calibrated to read milliwatts in terms of feet per second flow in the flowmeter, or alternatively, to read volumetric flow in terms of gallons per second, or mass flow in terms of pounds per second. However, the milliwatt meter may be calibrated to read any other parameter which the differential amplifier circuit is set up to measure, in an alternative embodiment of the invention.

It will be understood by those skilled in the art, that the embodiments shown and described herein are merely illustrative of the principles of the present invention, the scope of which is set forth in the appended claims.

What I claim is:

1. A differential amplifier circuit for comparing a pair of alternating current signals comprising in combination a pair of current discharge devices having substantially equal parameters, each of said devices having a first electrode for emitting a stream of current carriers, a second electrode for collecting the electrons of said stream, and a control electrode, said first electrodes connected together to a common junction, a potential source connected to said junction to energize the first electrodes of each of said current discharge devices to emit a stream of current carriers, a second source of potential of opposite polarity to said first source of potential connected directly to the collecting electrode of said one current discharge device and through a resistance $R_0$ to the collecting electrode of said other current discharge device for biasing each of said electrodes to collect said current carriers, a first signal input source of a first alternating current signal connected to the control electrode of said one current discharge device across a resistance $R_1$, a second reference signal input source of a second alternating current having the same frequency and phase as said first signal connected to the control electrode of said other current discharge device across a resistance $R_2$, where $R_1$ and $R_2$ are substantially equal, an output circuit connected to the collecting electrode of said other discharge device for superposing said first and second input signals to produce an output signal which is the algebraic difference between said input signals, said output signal being of the same frequency as said input signals and either substantially in phase with or 180 degrees out of phase with said input signals, and comparing means connected to said output circuit comprising a pulsing circuit triggered at the same frequency and phase as said input signals for deriving output pulses of one polarity or the other, depending on whether the amplitude of said first signal is larger or smaller than that of said reference signal.

2. A differential amplifier circuit in accordance with claim 1 wherein said current discharge devices are electron discharge tubes each having a cathode, a plate, and a control electrode, said current discharge devices having substantially equal parameters including amplification factors, said control electrodes being respectively connected to receive said input signals across substantially equal resistances $R_1$ and $R_2$, and said control electrodes being initially adjusted to substantially the same negative voltage bias in each of said tubes.

3. A differential amplifier circuit in accordance with claim 1 wherein said current discharge devices are transistors each having an emitter, a collector, and a base electrode, wherein said transistors are initially matched to have substantially equal parameters, producing substantially equal collector currents in said transistors, said base electrodes being respectively connected to receive said input signals across substantially equal resistances $R_1$ and $R_2$, and wherein said base electrode circuits are initially adjusted to provide equal current biases in each of said transistors.

4. A differential amplifier circuit for comparing a pair of alternating current signals comprising in combination a pair of current discharge devices having substantially equal parameters, each of said devices having a first electrode for emitting a stream of current carriers, a second electrode for collecting the electrons of said stream, and a control electrode, said first electrodes connected together to a common junction, a potential source connected to said junction to energize the first electrodes of each of said current discharge devices to emit a stream of current carriers, a second source of potential of opposite polarity to said first source of potential connected directly to the collecting electrode of said one current discharge device and through a resistance $R_0$ to the collecting electrode of said other current discharge device for biasing each of said electrodes to collect said current carriers, a first signal input source of a first alternating current signal connected to the control electrode of said one current discharge device across a resistance $R_1$, a second reference signal input source of a second alternating current having the same frequency and phase as said first signal connected to the control electrode of said other current discharge device across a resistance $R_2$, where $R_1$ and $R_2$ are substantially equal, an output circuit connected to the collecting electrode of said other discharge device for superposing said first and second input signals to produce an output signal which is the algebraic difference between said input signals, said output signal being of the same frequency as said input signals and either substantially in phase with or 180 degrees out of phase with said input signals, and comparing means connected to said output circuit comprising a phase comparator circuit for deriving an output signal of one polarity or the other, depending on whether the amplitude of said first signal is larger or smaller than that of said reference signal.

References Cited

UNITED STATES PATENTS

| | | | |
|---|---|---|---|
| 2,676,286 | 4/1954 | Buchner | 328—146 XR |
| 2,892,940 | 6/1959 | Ogletree | 328—146 |
| 3,310,688 | 3/1967 | Ditkofsky | 307—88.5 |

JOHN S. HEYMAN, Primary Examiner

J. ZAZWORSKY, Assistant Examiner

U.S. Cl. X.R.

328—146, 147